(12) United States Patent
Shiho et al.

(10) Patent No.: US 6,238,967 B1
(45) Date of Patent: May 29, 2001

(54) METHOD OF FORMING EMBEDDED DRAM STRUCTURE

(75) Inventors: Yasuhito Shiho, Austin; Carole Craig Barron, Cedar Park, both of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/289,915

(22) Filed: Apr. 12, 1999

(51) Int. Cl.$^7$ .................................................. H01L 21/8242
(52) U.S. Cl. ............................................ 438/244; 438/243
(58) Field of Search ........................... 438/244, 245–247, 438/243, 3

(56) References Cited

U.S. PATENT DOCUMENTS 5,773,314 * 6/1998 Jiang et al. .............................. 438/3

OTHER PUBLICATIONS

L. Nesbit et al., "A 0.6μm2 256Mb Trench DRAM Cell With Self–Aligned BuriEd STrap (BEST)", 1993 IEDM IEEE, Section 26.2.1, pp. 627–630.
S. Crowder et al., "An Embedded DRAM High–Performance 0.18μm Logic Technology with Copper BEOL", 1997 IEDM Technical Digest, pp. 45–48.
H. Ishiuchi et al., "Embedded DRAM Technologies", 1997 IEDM IEEE, Section 2.3.1, pp. 33–36.
J. Y. Lee et al., "Simultaneously Formed Storage Node Contact and Metal Contact Cell (SSMC) for 1 Gb DRAM and Beyond", 1996 IEDM IEEE, Section 22.2.1, pp. 593–596.

Shigehiko Saida et al., "Single Layer Nitride Capacitor Dielectric Film and High Concentration Doping Technology for 1Gb/4Gb Trench–type DRAMs", 1997 IEDM IEEE, Section 10.6.1, p. 265–268.

K.P. Muller et al., "Trench Storage Node Technology for Gigabit DRAM Generations", 1996 IEDM IEEE, Section 19.4.1, pp. 507–510.

C. Crowder et al., "Trade–offs in the Integration of High Performance Devices With Trench Capacitor DRAM", 1997 IEDM IEEE, Section 2.6.1, pp. 45–48.

* cited by examiner

Primary Examiner—Charles Bowers
Assistant Examiner—Craig Thompson
(74) Attorney, Agent, or Firm—Keith E. Witek (57) ABSTRACT

A method for forming an embedded DRAM integrated circuit (10) begins by forming an asymmetric source and drain structure on the DRAM pass transistors. The asymmetric DRAM transistor structure has a lightly doped shallow current electrode (60) that connects to a trench capacitor (30, 28, and 24). The bit line current electrode of the DRAM pass transistor is formed having an LDD region (60) and an adjacent highly doped drain region (76). The region (76) helped to improve DRAM data retention reliability. In addition, the current electrode connected to the bit line is silicided to form a silicide region (80) which has improved coupling to an overlying tungsten plug (84). In addition, a P-type halo implant (78) is used to reduce or eliminate adverse short channel effects within a DRAM device.

19 Claims, 7 Drawing Sheets

METHOD OF FORMING EMBEDDED DRAM STRUCTURE

FIELD OF THE INVENTION

The present invention relates generally to semiconductor manufacturing, and more particularly to a method for making an embedded dynamic random access memory (DRAM) cell.

BACKGROUND OF THE INVENTION

In the integrated circuit (IC) industry, manufacturers are currently imbedding dynamic random access memory (DRAM) arrays on the same substrate as CPU cores or other logic devices. This technology is being referred to as embedded DRAM (eDRAM). Embedded DRAM is likely to provide microcontroller (MCU) and other embedded controllers faster access to larger capacities of on-chip memory at a lower cost than that currently available using conventional embedded static random access memory (SRAM) and/or electrically erasable programmable read only memory (EEPROM).

However, the optimal structural needs and process steps needed to form optimal logic devices (e.g., flip-flops, inverters, etc.) is not compatible with the optimal processing and structures of a DRAM cell. For example, logic devices generally benefit from having higher doped source and drain regions, whereas DRAM cells generally benefit from lighter doped source and drain regions. AN issue becomes, how can these two different structures be accomodated in an integrated DRAM and logic process flow to make eDRAM without compromising one of either the DRAM devices or the logic gate devices. In addition, DRAM performance is generally improved by providing shallower source and drain regions whereas logic gates generally benefit by providing at least a portion of the source and drain regions as a deeper doped region. For example, logic gates generally use lightly doped drain (LDD) extensions and highly doped drain (HDD) regions together to improve logic gate performance where such regions in a DRAM device may increase leakage current and/or adversely affect DRAM data retention times.

Further, logic gates generally provide improved performance when containing silicided or salicided source and drain regions. However, salicidation of source and drain regions in a DRAM array may also lead to higher diode leakage within the DRAM cell and poor data retention within the DRAM array. Logic cells generally require the use of interconnect materials that have reduced resistance as opposed to the polysilicon interconnect and plug material that is conventional in DRAM pass transistor contacts. Therefore, tungsten plugs, aluminum plugs, and/or copper interconnects are advantageous within a logic portion of an integrated circuit while tungsten plugs and like metallurgy close to the DRAM pass transistor source and drain regions will generally inhibit the performance of the DRAM cell.

Therefore, a need exists in the industry for a new source and drain configuration for DRAM pass transistors and a new DRAM bit line contact structures that can accommodate the advantageous structures and processes used in the logic portion of the integrated circuit while simultaneously ensuring that DRAM performance is acceptable.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Generally, the method taught herein in FIGS. 1–15 teaches an improved integrated circuit fabrication process which enables the formation of both logic devices and DRAM arrays on the same integrated circuit. More specifically, the process taught herein in FIGS. 1–15 allows logic gates to be formed with proper lightly doped drain (LDD) and highly doped drain (HDD) doping depths, profiles, and concentrations while simultaneously ensuring that the concentrations, depths, and structure of current electrodes within the DRAM array portion of the integrated circuit are also acceptable. In FIGS. 1–15, silicide may be used on top of source and drains within the logic array where silicide from this process may also be integrated into the DRAM array in a manner that is acceptable to DRAM performance. Deeper source and drain regions than are currently advisable in DRAMs are used within the DRAM array herein to allow silicided and metallic contact regions that are amenable to high performance logic gates. In other words, the nonsymmetrical deeper bit line source/drain in the DRAM array allows for the use of logic gate tungsten plug technology across the whole the integrated circuit. By allowing the use of silicides and tungsten plugs, existing high performance logic processes can be maintained in a logic portion of the integrated circuit while such technology can be integrated into a DRAM array on the same substrate with reduced processing steps, reduced cost, and acceptable and competitive diode leakage and data retention within the DRAM cell.

The invention can be further understood with specific reference to FIGS. 1–15.

Figure 1:
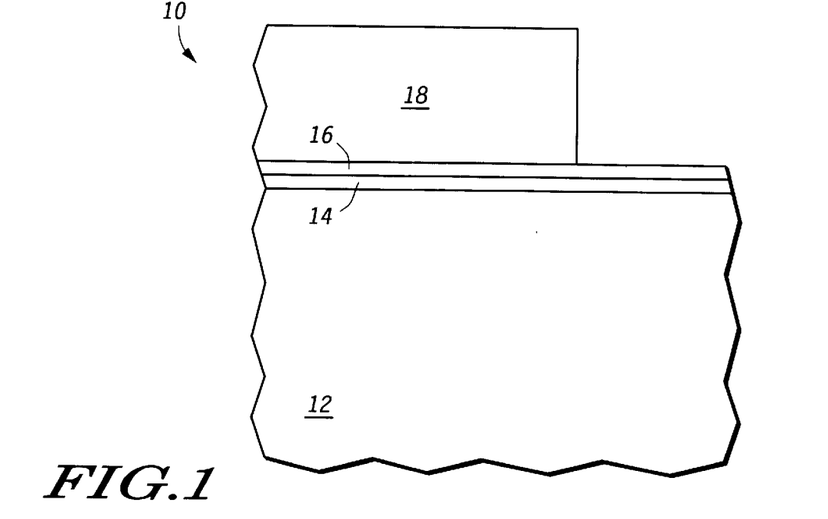
FIGS. 1–15 illustrate, in cross-sectional diagrams, a method for forming an embedded DRAM array on the same substrate as logic devices.

FIG. 1 illustrates the beginning process steps that are used to form an embedded DRAM integrated circuit 10. FIG. 1 illustrates a substrate 12. In one form, the substrate 12 is a silicon wafer. In other forms, the substrate 12 may be silicon germanium, germanium, gallium arsenide, other III–V compounds, silicon carbide, conductive nitrides, silicon on insulator (SOI) substrates, epitaxial layers, and/or other substrate materials or compositions.

A pad oxide layer 14 is formed over a top of the substrate 12 as illustrated in FIG. 1. Generally, the pad oxide or pad dielectric is anywhere from roughly 50 angstroms in thickness to several hundred angstroms in thickness. Generally, the layer 14 is formed by thermally growing silicon dioxide on top of the substrate 12 within a furnace. However, the layer 14 may be formed by chemical vapor deposition (CVD), physical vapor deposition (PVD), combination of deposition and growth, or similar manufacturing processes. The layer 14 may be made of other dielectric materials other than silicon dioxide, such as silicon oxynitride, refractory metal oxides, or like dielectrics. Generally, any dielectric material taught herein may be replaced with any other dielectric material used in the IC industry.

A barrier layer 16 is deposited on top of the layer 14 as illustrated in FIG. 1. In one form, the layer 16 is a silicon nitride layer. In other forms, the layer 16 may be a silicon-rich silicon nitride, a silicon oxynitride layer, a refractory metal nitride, composites of these aforementioned materials, or another dielectric material. Preferably, the layer 16 is formed by chemical vapor deposition (CVD). However, the layer 16 may be formed by other deposition techniques, such as sputtering or spin on glass (SOG) processing. After formation of the layers 14 and 16, photoresist is spun, baked, and developed over the layer 16 as illustrated in FIG. 1.

Figure 2:
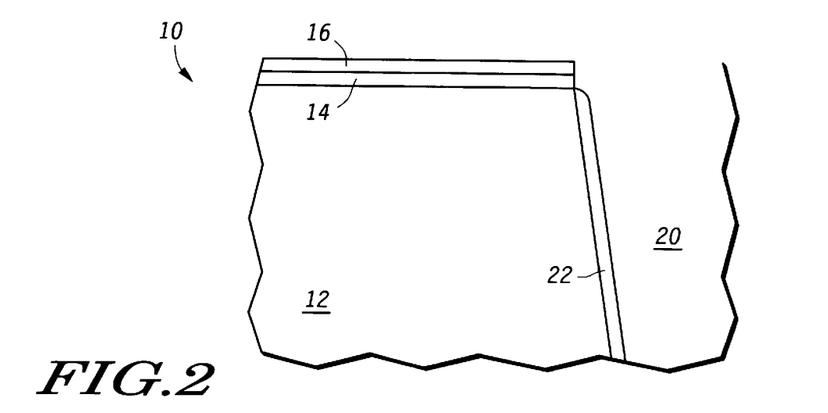

FIG. 2 illustrates that exposed portions of the substrate 12, the layers 14, and the layer 16 not underlying the photoresist mask layer 18 are etched to form a trench region 20. Preferably, the etch technology used to form the trench 20 is referred to as reactive ion etching (RIE) or plasma etch processing. However, any etch process or combination of etch processes which is capable of forming a trench region 20 may be used in FIG. 2. As an example, the layers 16, 14, and 12 may be etched in FIG. 2 by a non-selective etch process. In another form, the layer 16 may be etched by a nitride etch, while the layer 14 is etched by a following oxide etch chemistry, while the substrate 12 is then etched by a semiconductor or silicon etch process. Furthermore, wet etches or anisotropic etching may be used within trenches taught herein to round trench corners to improve device reliability (e.g., reduce the chance of electrical breakdown around very sharp conductive corners). Generally, the trench 20 is formed to a depth of roughly 4–20 microns with a depth in the vicinity of 6–10 microns being preferred. It is important to note that the depth of the trench 20 herein anticipates using a capacitor dielectric with a dielectric permittivity in the range of roughly 3.5 to 5.0. If a higher-K dielectric is used as the capacitor dielectric, the trench depth can be reduced accordingly while still obtaining an adequate DRAM storage capacity.

After formation of the trench 20, a thermal oxidation and/or a dielectric deposition process is used to form a trench liner dielectric 22 as illustrated in FIG. 20. The liner dielectric is generally used to relieve stress and remove defects along surface portions of the trench region after the trench process has been performed, or a sacrificial oxide (not specifically shown in FIG. 2) may be used for such a purpose. In addition, this dielectric layer 22 will eventually function as a capacitor dielectric. Therefore, the layer 22 may be oxynitride, silicon nitride, tantalum pentoxide, semiconductor oxides, other refractory metal oxides or nitrides, ferroelectric material, high K materials, composites thereof, or the like.

Figure 3:
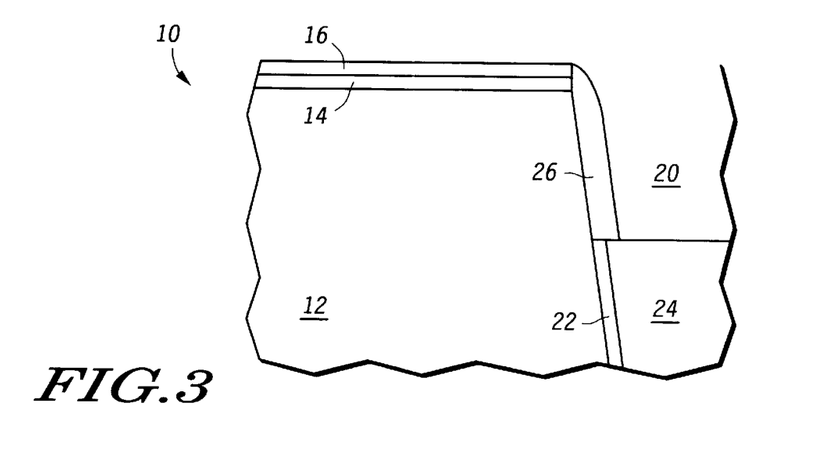

FIG. 3 illustrates that a conductive or semiconductive layer is deposited over an entire surface of the structure 10 from FIG. 2. This conductive or semiconductive layer is then chemically mechanically polished (CMP) and/or subject to an etch back or resist etch back (REB) operation to result in the recessed conductive plug region 24 in a bottom portion of the trench 20. In one form, the region 24 is made of doped polysilicon, doped amorphous silicon, germanium silicon, a metallic material, composites thereof, or a like conductive and/or semiconductive material. After the chemical mechanical polish (CMP) and/or etch back processing to form the region 24 is complete, exposed portions of dielectric layer 22 located along a side wall of trench 20 are removed by a dielectric etch process. This etch process is usually a wet etch process, but may also be a plasma or reactive ion etch process with an optional wet clean.

After the top exposed portion of the dielectric 22 is removed in FIG. 3, a deposition process followed by a spacer etch process is used to form a dielectric spacer 26 as illustrated in FIG. 3. In one form, the spacer 26 has a width that is greater than a grown thickness of the layer 22 as shown in FIG. 3. This thicker oxide 26 is formed to provide a thicker isolation between transistor electrodes and the capacitor trench structure to improve the operation of the DRAM cell. It should be noted that, in another embodiment, the layer 22 and a top portion of the trench 20 need not be removed in FIG. 3, whereby layer 22 is left unetched and is incorporated into the spacer 26 by deposition of additional material on top of the exposed layer 22. In this case, a composite of some CVD dielectric film along with the dielectric layer 22 is formed in FIG. 3. Generally, the material used to form spacer 26 is tetraethelorthosilicate (TEOS), silicon dioxide, fluorinated TEOS, silicon oxynitride, silicon nitride, and/or a like dielectric material.

Figure 4:
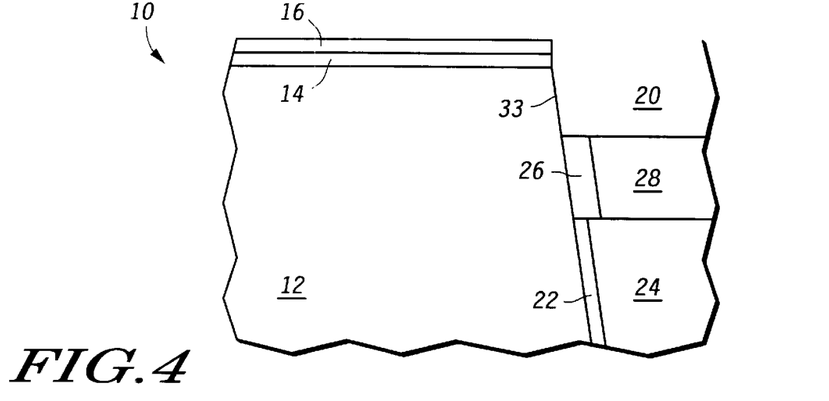

FIG. 4 illustrates that another blanket deposition of a conductive and/or semiconductive layer is performed after formation of the spacer 26. This second conductive and/or semiconductive layer is also exposed to a chemical mechanical polish (CMP) and/or etch back processing in order to form the plug region 28 within the trench 20 and overlying the region 24 as illustrated in FIG. 4. In another form, the layer 28 may be selectively grown from the underlying layer 24 using epitaxial growth. After etch back and/or polishing of the semiconductive or conductive layer to form the second plug region 28, a top portion of the spacer 26 is exposed within the trench 20. FIG. 4 illustrates that another dielectric plasma and/or wet etch process is used to remove a top exposed portion of the spacer 26 along a sidewall 33 of the trench region 20 as shown in FIG. 4. At this point, an optional low energy tilt and rotational implant or a thermal diffusion step may be used to dope the exposed sidewall 33 of the substrate 12 located within the trench 20. This optional sidewall doping is done to form all or a portion of the optional interconnect 31, which is shown later in FIG. 7 as being formed by yet another method.

Figure 5:
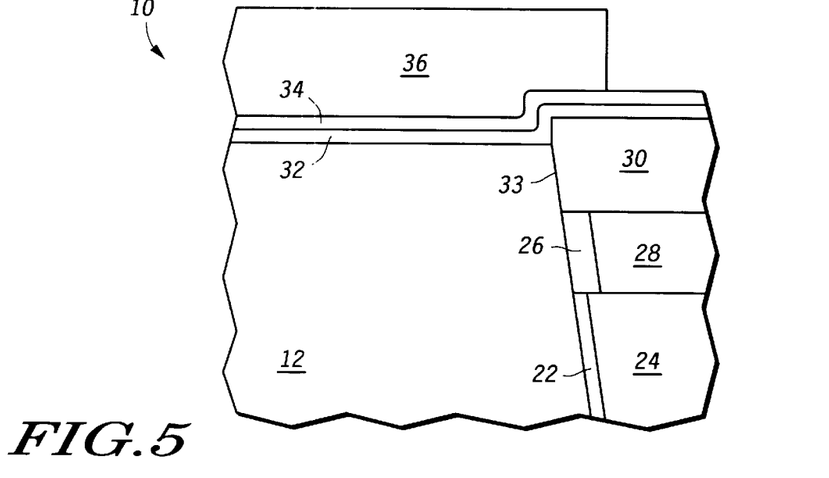

FIG. 5 illustrates that a third semiconductive or conductive layer is deposited over the structure 10 after formation of the region 28 and exposure of the sidewall 33 of the substrate 12. This third semiconductive or conductive layer will lie within a top portion of the trench 20 illustrated in FIG. 4 and will initially lie over a top portion of the layer 16. This layer is also subject to chemical mechanical polishing (CMP) and/or an etch back procedure in order to complete a filling of the trench 20 with an upper conductive plug portion 30 as shown in FIG. 5. Also note that, like the region 28, the region 30 may be selectively grown from the underlying material 28 instead of using a CVD operation to provide the material used for form region 28. The conductive regions 30, 28, and 24 are electrically coupled to each other to form a capacitor electrode of the DRAM trench capacitor structure. In one form, after formation of the region 30, the layers 16 and 14 from FIG. 4 are removed and a new pad thermal oxide layer 32 is formed that is similar to the previous layer 14. Another dielectric barrier layer 34. which is analogous to layer 16 of FIG. 1, is formed over the new pad oxide layer 32. In one form, the layer 34 is made of silicon nitride, silicon-rich silicon nitride, or a like material. A photoresist layer 36 is then formed and patterned over the top of the layer 34 in order to expose a portion of the trench capacitor region as illustrated in FIG. 5. There are many methods of forming a DRAM capacitor electrode other than that shown in FIGS. 1–5. A two polysilicon or single polysilicon approach may be used in lieu of the three polysilicon processes taught herein.

Figure 6:
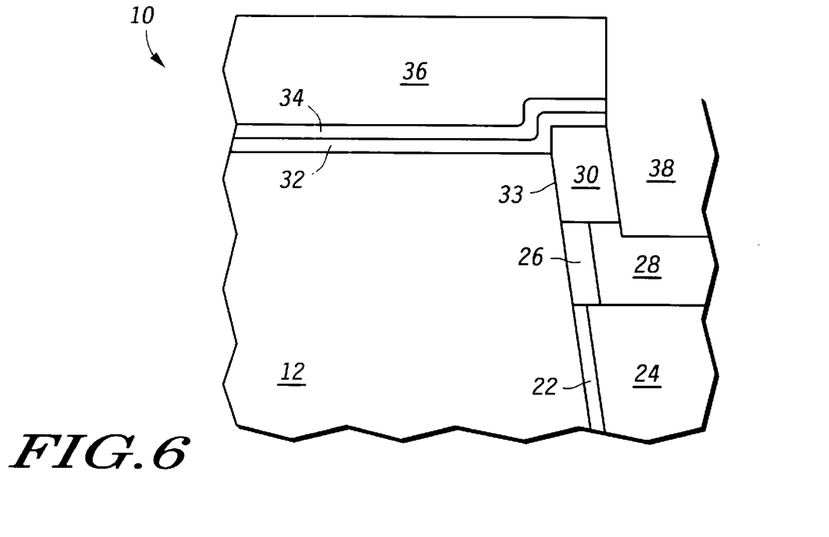

In FIG. 6, one or more dielectric etch steps are used to form a trench region 38 within one or more of the capacitor electrode regions 24, 28, and 30 as shown in FIG. 6. The etch processing used to form region 38 may be a non-selective timed etch or may be a combination of nitride etches, oxide etches, and/or silicon etch steps. The trench 38 is generally formed to a depth of less than 3 microns and may be as shallow as a few thousand Angstroms. however, any depth may be used for trench 38 as long as adequate isolation is obtained between electrical devices across the IC 10. The trench 38 is also positioned so that a side wall contact 33 coupling the substrate 12 to the region 30 is preserved. In addition, the trench region 38 is positioned so that the coupling between the regions 30, 28, and 24 are preserved as shown in FIG. 6. Therefore, the placement of the trench 38 is sufficient to ensure that the DRAM capacitor integrity and structure is not compromised. After formation of the trench region 38, the photoresist region 36 is removed.

Figure 7:
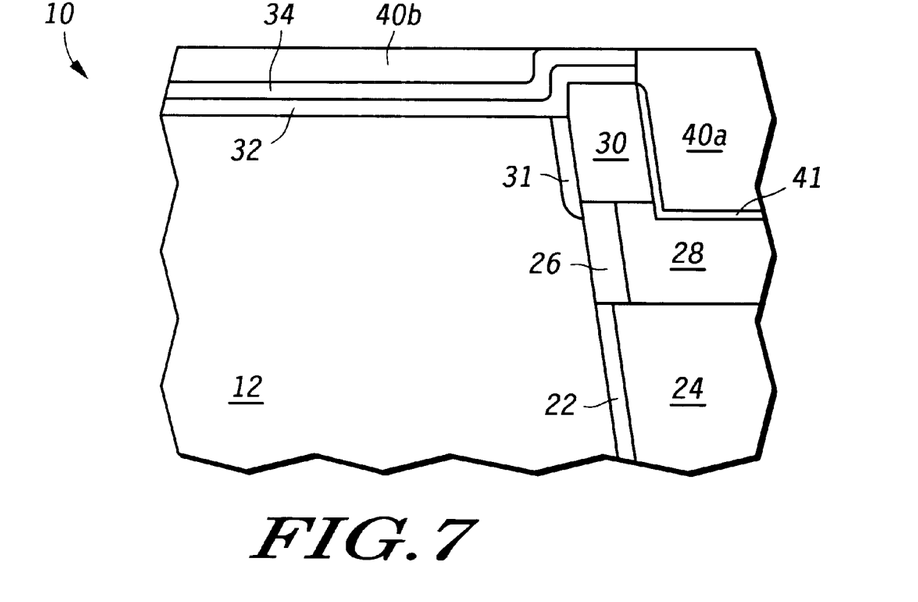

FIG. 7 illustrates that the trench region 38 is filled by chemical vapor deposition (CVD), thermal oxidation, and/or physical sputtering of one or more dielectric materials. Generally, this dielectric material can be any material that can provide adequate electrical isolation between conductive regions of the integrated circuit 10. In many cases, these trench fill materials are dielectric layers such as silicon dioxide, germanium oxide, BPSG, composites thereof, or like dielectrics. In other cases, a dielectric liner 41 may be formed in FIG. 7 with the fill material 40a being electrically-floating semiconductive or conductive material (e.g., silicon germanium or polysilicon). Even when using a dielectric trench fill material, an thermal oxide liner 41 is usually formed by thermal oxide growth and/or chemical vapor deposition prior to deposition and CMP of the trench fill material. However, the liner 41 is optional in some cases. After formation of the optional layer 41, the trench filled deposition material is chemically mechanically polished (CMP) and/or etched back to form a dielectric plug region 40a as shown in FIG. 7. Due to the slight non-planar surface that existed over the structure 10 prior to the formation of region 40a, a slight residual region of polished dielectric 40b may remain over a top surface of the active area of substrate 12 as shown in FIG. 7. In some cases, these nonuniformity issues may be reduced in severity or eliminated by uses over-etching and/or etch back to level the regions 30 and/or 40a to the top surface of the substrate 12 in previous processing steps. After the chemical mechanical polishing and/or etch back of the trench fill layer to form the plug 40a, a series of oxide and/or nitride etch steps are used to remove the layers 40b, 34, and 32 from the surface of the structure 10. Alternatively, a silicon selective etch that etches both oxide and nitride may be used to remove layers 40b, 34, and 32.

In FIG. 7, various thermal processing and elevated temperature steps will result in a thermal diffusion of dopant atoms (e.g., phosphorus, boron, arsenic, antimony, etc.) from the region 30 through the sidewall portion 33 of the substrate 12 to form a doped region 31 within the substrate 12. This outdiffusion of dopants from region 30 into the substrate 12 is generally advantageous since the layer 30 is typically a doped polysilicon and/or doped amorphous silicon layer. PN junctions created within amorphous silicon or polysilicon material tend to have greater leakage current than single crystalline silicon PN junctions. Since the substrate 12 is a single crystalline silicon material in one form, creation of region 31 in the silicon substrate will result in a single crystalline silicon PN junction that has less leakage current. However, it is not always necessary to form the layer 31 in FIG. 7, especially if the layer 30 is formed of a material that is not likely to form high leakage PN junctions.

Figure 8:
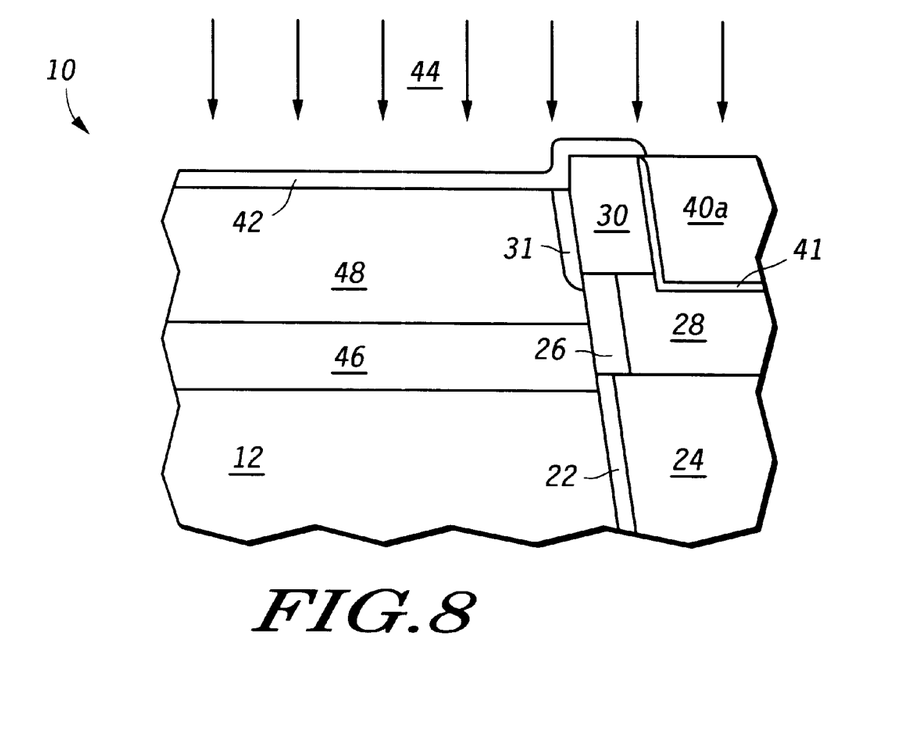

FIG. 8 illustrates that a layer 42 is formed over a top of the substrate 12 and the region 30. In one form, this layer 42 is the same layer 32 shown in FIG. 7 where the layer 32 is not previously removed as discussed with respect to FIG. 7. In another form, layer 32 is removed as previously discussed and layer 42 is a new layer of thermally grown silicon dioxide over the substrate 12 and the region 30. In yet another form, the layer 42 may be a deposited dielectric layer of any type. The layer 42 is formed to provide scattering for one or more ion implant steps 44 illustrated in FIG. 8. In one embodiment, a first ion implant step 44 is used to implant a deep region 46 as illustrated in FIG. 8. Generally, the substrate 12 is formed of a first conductivity type, such as P-type silicon. The doped region 46 is then ion implanted by a step 44 to form a layer of silicon having a second conductivity type (e.g., N type). Therefore, if the substrate 12 is P-type silicon (e.g., doped with boron), the layer 46 is formed by doping this region of the substrate to an N-type conductivity (e.g., doped with arsenic or phosphorus). After forming the region 46 with a relatively high energy ion implantation process, a lower energy ion implantation process is used to form a P-well 48 as illustrated in FIG. 8. This second ion implant step 44 will ion implant a P-type dopant to form the well 48 above a bottom portion of the N-type dopant region 46 whereby 46 is now formed as a buried layer. The well 48 is isolated by the N-type region 46 in order to allow the region 48 to be electrically biased during operation in order to improve the performance of the subsequentally formed DRAM cells.

In FIGS. 1–8, only a DRAM portion of the integrated circuit structure 10 has been illustrated since the FIGS. 1–8 only concern processing that occurred within the DRAM cell area or the processing that was occurring in the logic section of the integrated circuit was identical to that occurring in FIGS. 1–8. However, after FIG. 8, the DRAM portion 11 of the integrated circuit 10 is illustrated in addition to the logic portion 13 of the integrated circuit 10 in order to clearly illustrate some different processing that is occurring in these two regions.

Figure 9:
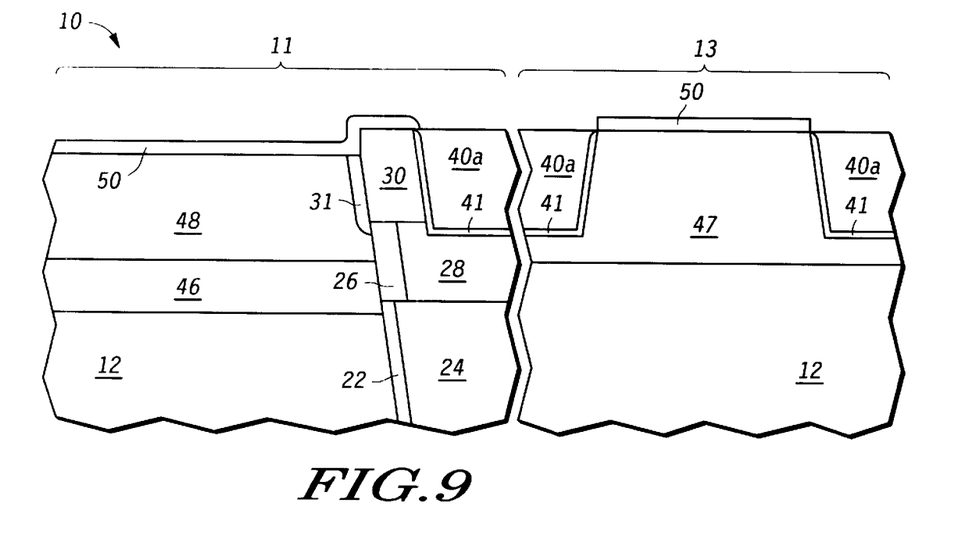

In FIG. 9, the layer 42, which was subject to the ion implantation processes 44 and is likely now damaged, is removed from the surface of the structure 10. A gate dielectric layer 50 is then formed over a top of the regions 11 and 13 as shown in FIG. 9. The layer 50 may be formed by one or more of a silicon dioxide layer, a silicon nitride layer, a thermal oxide, an oxynitride layer, a refractory metal oxide, a high K dielectric, composites thereof, or like dielectric materials.

Figure 10:
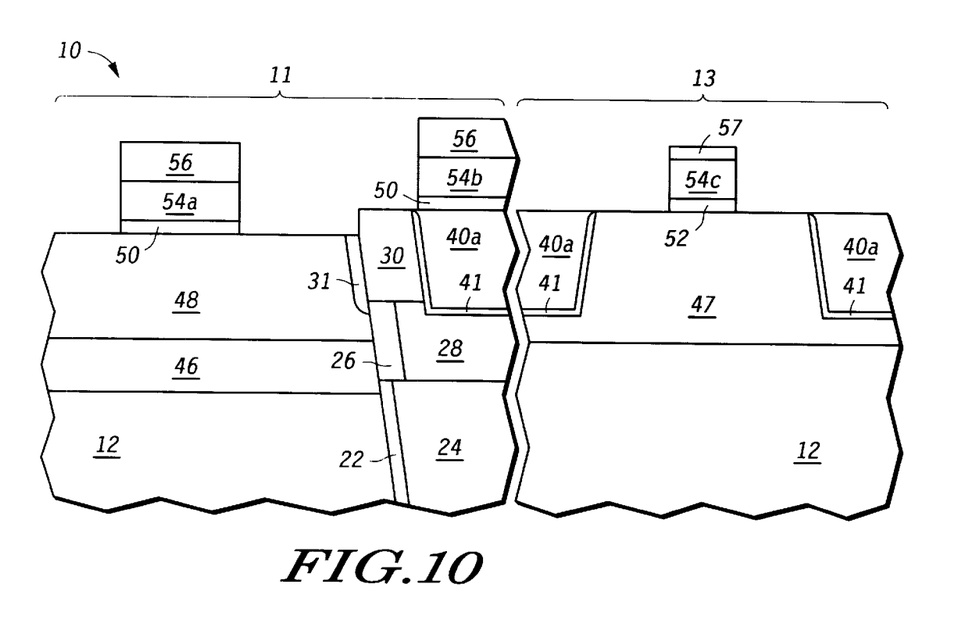

In FIG. 10, the DRAM transistors within region 11 generally have better performance when a thicker gate dielectric 50 is used. Therefore, the dielectric 50 in both regions 11 and 13 is formed to a greater thickness to accommodate the greater thickness that is optimal within the DRAM transistors. However, logic transistors within the region 13 typically require thinner dielectric layers or dielectric layers with higher dielectric constants in order to improve logic gate performance. Therefore, the layer 50 in FIG. 9 is selectively removed from the region 13 and replaced with a gate dielectric 52. Gate dielectric 52 is a thinner dielectric region 52 and/or is made of a material that has a higher dielectric constant that that used for layer 50. In another form, a thin layer 50 may be formed followed by a masking of region 13 and a thickening of the layer 50 in region 11. Therefore, it should be clear that many different processes exist to form a first and second gate dielectric layer having different properties. Generally, FIGS. 9–10 are used to illustrate the concept that two different regions 11 and 13 of the same integrated circuit 10 may be easily manufactured with different gate dielectric materials and/or thicknesses to individually optimize the performance of the different regions 11 and 13.

After formation of the gate dielectrics 50 and 52, a conductive gate electrode layer is deposited over an entire surface of the structure 10. This gate electrode layer is one or more of polysilicon, amorphous silicon, a metallic material, a silicide, combinations thereof, or like materials. A photolithographic and etch process sequence is used to pattern the gate electrode layer into individual transistor gate electrodes 54a and 54c and gate electrode local interconnects 54b as illustrated in FIG. 10. Before patterning of the gate electrodes, it is desirable in some cases to form a capping dielectric layer over the gate electrode layer. FIG. 10 illustrates that the gate electrode layer is capped with an silicon nitride or like capping layer before photolithographic patterning and etching to result in a nitride cap 56 over the regions 54a and 54b and a nitride cap 57 over the gate electrode 54c. In FIG. 10, one of many different possible process sequences may be used to form a thicker nitride cap 56 in the DRAM region 11 and a thinner gate electrode nitride cap 57 within the region 13 as shown in FIG. 10. However, in another form, the layer 56 and the layer 57 may be the same material and/or the same thickness. In the case of a deposited gate dielectric layer 50, the layer 50 will exist under the word line connection 54b as shown in FIG. 10. In the case where the gate dielectric 50 is grown by thermal oxidation or a like process and the layer 40a is not a conductive or semiconductive trench fill region, the layer 50 will likely not underlie the layer 54b as illustrated in FIG. 10.

Figure 11:
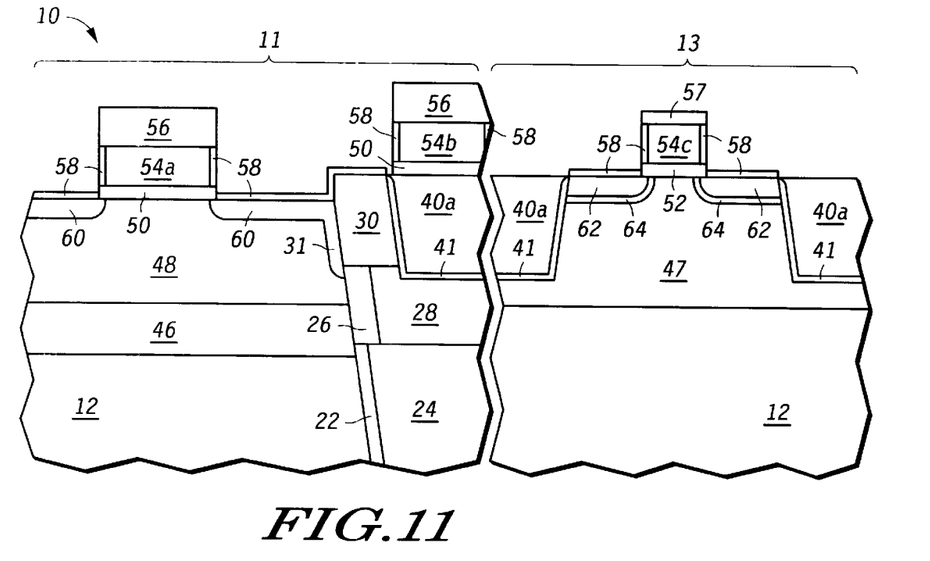

FIG. 11 illustrates that a thermal oxidation process is performed in order to sidewall oxidize the regions 54a, 54b and 54c to form sidewall oxides 58. This sidewall oxidation also oxidizes horizontal top surface of the well regions 48 and 47 from FIG. 10. After formation of this thermal oxide regions 58, one or more lightly doped drain (LDD) ion implantation processes are used to form lightly doped drains (LDD) regions 60 in the DRAM region 11 and lightly doped drains (LDD) regions 62 in the logic region 13. In one form, a single ion implantation step that is self-aligned to the gate structures 54a–54c is used to simultaneously form the LDD regions 60 and 62. In another form, a blanket LDD implantation in both regions 11 and 13 may be used followed by a masking of one of the regions 11 and 13. After masking of one of the regions 11 or 13, other unmasked region 11 or 13 may be exposed to a second ion implant to increase the doping concentration of just one of the LDD regions 60 and 62. Generally, this second technique of doing a blanket LDD implant in both regions 11 and 13 followed by a second implant in only one of the regions 11 or 13 would be used to form regions 62 with a higher doping concentration that the regions 60. Such can be done by complementary doping the N regions 62 to a higher doping N type concentration or by counterdoping the regions 60 with a P type implant.

In yet a third form, the region 13 may be masked by photoresist whereby the region 11 is ion implanted to form the LDD regions 60. After the formation of region 60 mutually exclusive of region 62, the photoresist is removed from region 13 and placed on region 11 whereby the LDD region 62 may be formed entirely by a second ion implant process without affecting the previously-formed LDD regions 60. This process can also be performed in reverse order where the regions 62 are formed before the regions 60. In any event, the LDD regions 60 and 62 shown in FIG. 11 are formed with equal or non-equal doping and/or with equal or non-equal geometric form. Generally, performance is improved if the regions 60 are lighter doped than the regions 62.

In addition, FIG. 11 illustrates that the region 11 is masked from an ion implantation process while region 13 is implanted with a P-type graded channel or halo implant to form a P-doped region 64. This ion implantation of a P-type region 64 symmetrically around or adjacent the LDD regions 62 allows for electric fields along a channel region underlying gate 54c to be controlled in order to enhance logic transistor device performance. Gate oxide damage and hot carrier injection can be reduced, and short channel effects of the MOSFETs located in region 13 can be reduced by the presence of one or more regions 64 around one or more regions 62 in the region 10. Note that the LDD region 60 located to a right hand side of 54a is coupled to the sidewall contact 31 whereby the LDD region 60 connects to the trench capacitor storage electrode formed by regions 30, 28, and 24.

Figure 12:
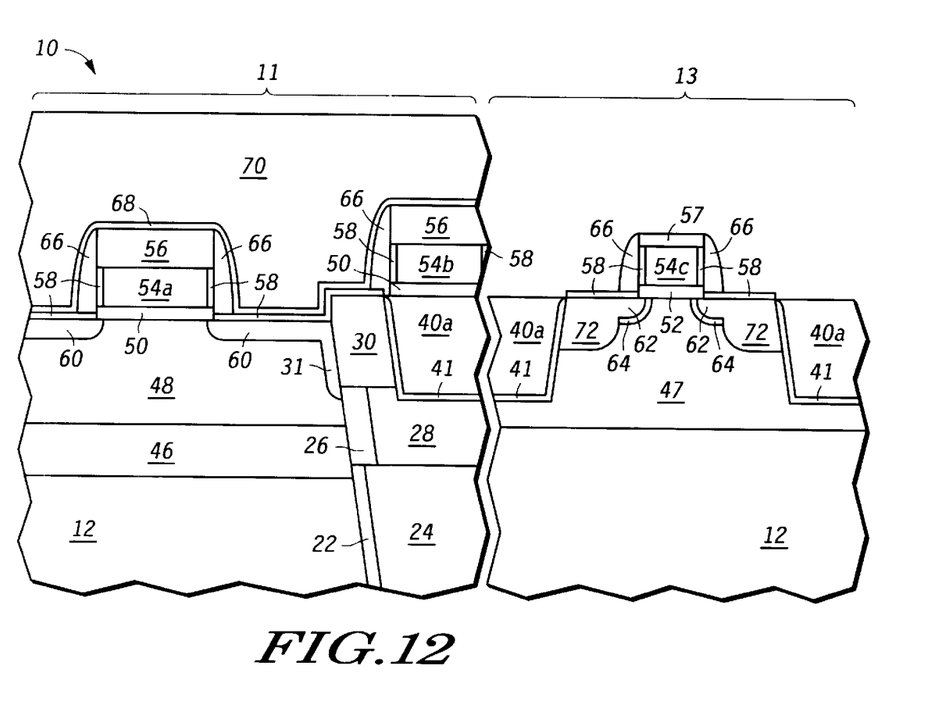

FIG. 12 illustrates that a dielectric sidewall spacer 66 (which is usually a silicon nitride or like material) is formed over the device 10, followed by the formation of a masking layer 68 over the entire device 10. In one form, the layer 68 is a silicon nitride layer, but the layer 68 can be any other barrier material that prevents subsequent silicidation of regions that underlie the layer 68. Portions of the layer 68 are removed from region 13 as shown in FIG. 12. This removal is selectively enabled by forming a photoresist mask 70 which protects the layer 68 in region 11 but while allowing removal of the layer 68 from the region 13 when in the presence of a nitride etch chemistry. In addition to acting as a nitride etch mask, the photoresist layer 70 is also used as an ion implantation mask so that highly doped drain (HDD) regions 72 can be ion implanted in a self-aligned manner as shown in FIG. 12. After formation of the HDD regions 72 in FIG. 12, the photoresist 70 is removed from the top surface of the device 10.

Figure 13:
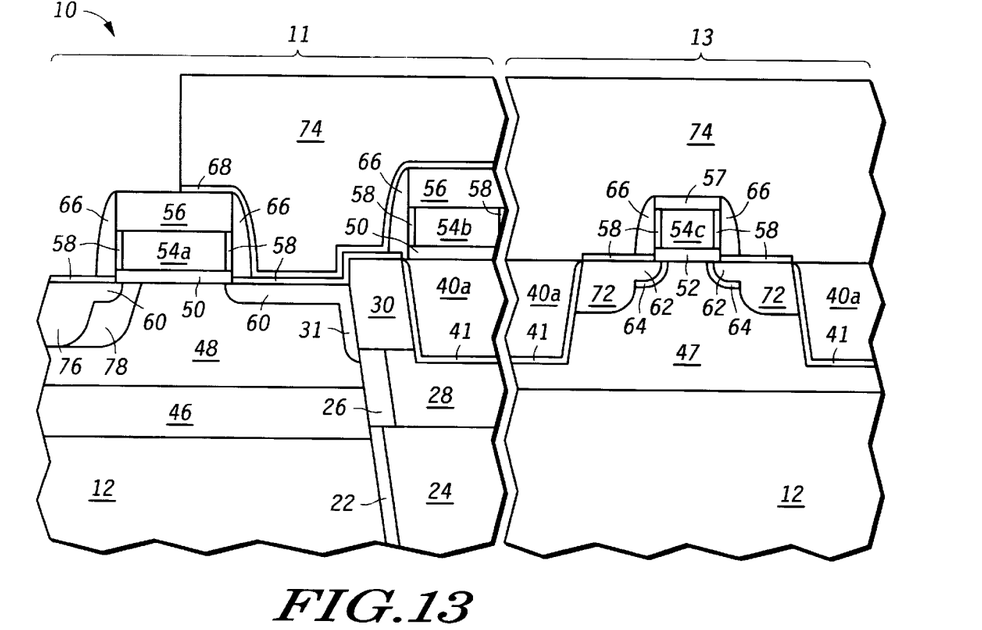

FIG. 13 illustrates that another masking layer of photoresist 74 is provided and patterned over the integrated circuit 10. The photoresist 74 will cover the logic region 13 and the portion of the DRAM region 11 that contains the trench capacitor and the trench capacitor contact region 60 and 31. The portion of the nitride layer 68 that is exposed via openings in photoresist layer 74 is removed by a silicon nitride wet etch or like wet and/or plasma etch step. At this point, another highly doped drain (HDD) ion implant step is used to form a deep and higher doped N-type drain region 76. However, this region 76 is only formed on the side of the DRAM transistor that is going to couple to the DRAM cell's bit line. In addition, while the masking layer 74 is still in place, a P-type halo or tilt and rotational implant is utilized to form a P-type doped region 78. Like the region 76, the region 78 is only formed on the bit line side of the DRAM pass transistor in region 11 as illustrated in FIG. 13.

It is important to note that the resist masking process used in FIGS. 12 and 13 may be different or performed in a different order. Also, the regions 72 and 76 may be fully formed or at least partially formed by a common implantation step. In this embodiment, the resist layers 70 and 74 are merged into one layer that exposes the device 10 in both regions 11 and 13 for simultaneous formation of the regions 72 and 76 by one or more common implants. In addition, the region 78 which is a P-type halo implant is generally an optional step and need not be included in all DRAM devices formed using the process taught herein. After formation of the regions 76 and 78 in FIG. 13, the photoresist layer 74 is removed from the surface of the device 10.

Figure 14:
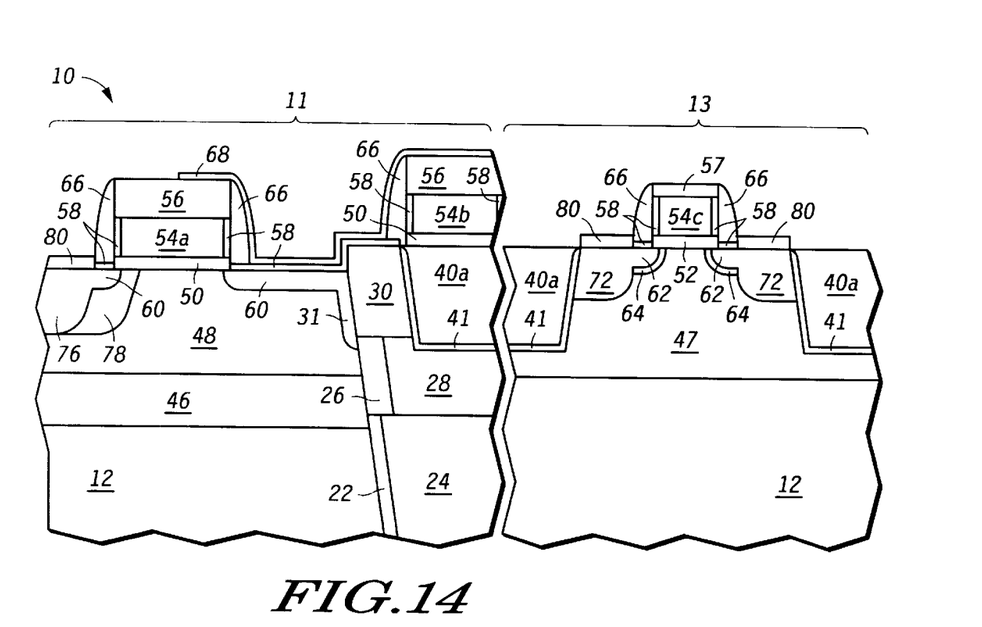

After removal of the photoresist layer 74 some portion of the nitride layer 68 will remain over the surface of the device 10 whereby this barrier layer 68 covers a portion of the silicon region 30, the silicon region 31, and the LDD region 60 located to the right hand side of gate 54a. At this point, a refractory metal material is deposited over all surfaces of the device 10 in FIG. 14. A thermal process, exposure o the device 10 to energy, or a like salicidation process is then used to form a silicide and/or a salicide region 80 on the exposed surfaces of region 72 and region 76 as shown in FIG. 14. Unreacted refractory metal that has not been silicided is then removed from the surface of the device 10 by a wet etch process whereby the silicide regions 80 remain behind on the device 10. Due to the presence of the barrier layer 68, no silicide or salicide reaction occurs over the regions 60, 31, and 30 located to a right hand side of gate electrode 54a. At this point, the layer 68 may be removed by nitride wet etch processing or may be left behind on the device as illustrated subsequentally in FIG. 15. Generally, the layer 80 is formed as a cobalt silicide layer but can be any other silicide material or metallic material such as a refractory nitride, platinum silicide, tungsten silicide, titanium silicide, and/or like materials. It is also important to note that a two step salicidation process may be used in FIG. 14 so that the silicide formed in source and drain regions of the logic area 13 is different in composition or thickness of the silicide formed within the DRAM region 11.

Figure 15:
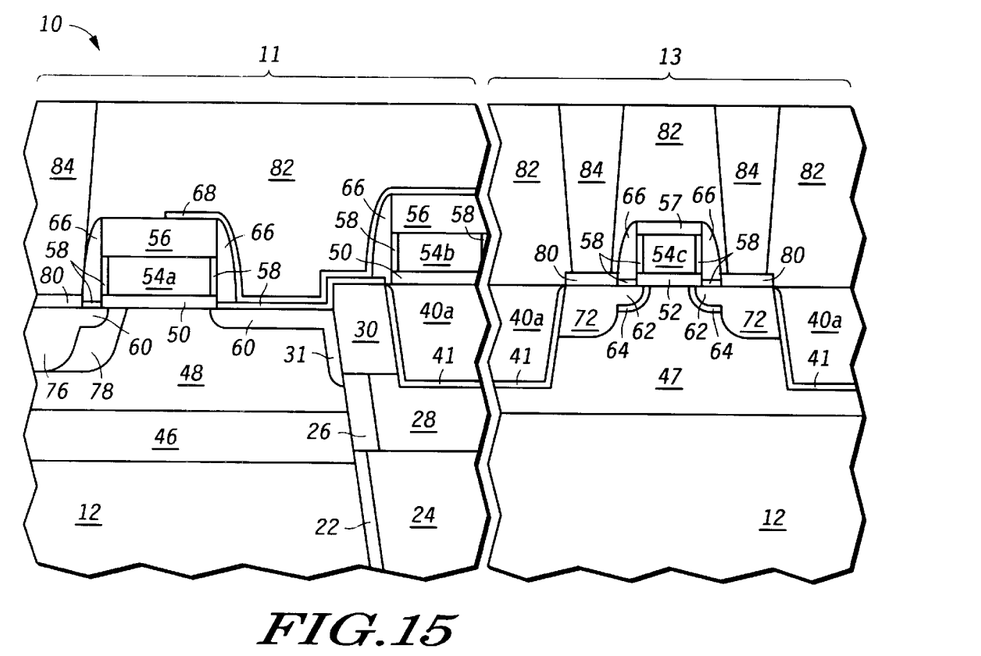

FIG. 15 illustrates than an interlayer dielectric (ILD) 82 is formed over a top of the device 10. This interlayer dielectric 82 is formed from one or more materials such as borophosphosilicate glass (BPSG), phosphosilicate glass (PSG), low K dielectric materials, fluorinated TEOS, xirogel, silicon dioxide, tetraethelorthosilicate (TEOS), oxynitrides, silicon nitride, germanium oxide, composites of dielectrics, or the like. The layer 82 may be etched back, resist etched back, subject to chemical mechanical polishing, thermally reflowed, or subject to anneal processes as are necessary to improve the quality of the device 10. After formation of a blanket dielectric layer 82, photoresist and etch processing is used to form openings within the layer 82 that expose various regions of the gate structures 54a, 54b, and/or 54c and/or silicided regions 80 as illustrated in FIG. 15. A refractory metal or metallic material is then deposited over the device 10 to fill the openings formed in the layer 82. Etch back processing and/or chemical mechanical polishing is then used to remove any conductive material off of top planar surfaces of the layer 82 to form conductive plugs 84 within the openings in layer 82 as illustrated in FIG. 15. In one form, the conductive plugs 84 are tungsten plugs or is a composite that contains substantial quantities of tungsten (W). Other refractory metals, aluminum, copper, alloys thereof, or the like may be used for the plugs 84. Barrier layers such as titanium tungsten, titanium nitride, tantalum nitride, or other materials may exist along a sidewall and bottom portion of the plug regions 84. In addition, the plug regions 84 may be self-aligned contacts that are aligned by the spacer 66 and layers 56 or may be non-self-aligned contacts located within the regions 11 and 13.

Generally, it was found that the embedded DRAM device illustrated in FIG. 15 was improved over preexisting embedded DRAM structures due to the presence to the regions 76, 78, 68, 80, and 84 as well as other layers within FIG. 15. Specifically, by providing a deeper region 76 under the DRAM bit line contact, it was found that a tungsten plug 84 could be used to contact the DRAM array 11 as opposed to a polysilicon plug which is typically the DRAM contact material of choice in the art. The use of a refractory metal plug 84 in both the regions 11 and 13 preserves the high performance of logic transistors while simultaneously improving performance of the DRAM array 11. This integration of tungsten into both the DRAM region 11 and the logic region 13 also reduced processing steps. However, tungsten plugs that contact silicon-based regions result in increased current leakage and may adversely affect the data retention properties of the DRAM array 11. To avoid these disadvantages, or at least reduce their impact to acceptable levels, the non-symmetrical source and drain regions set forth in FIG. 15 are used whereby a deeper region 76 is formed at least under the tungsten contact 84 in region 11. The formation of the deep region 76 has been shown to reduce the leakage current usually associated with tungsten plugs used in IC processing, and has improved the data retention of the DRAM memory cell.

It was further found that selective salicidation of only the current electrode that contacts to the bit line tungsten plug 84 further improved the performance of the DRAM. In addition, the deepening of the region 76 in FIG. 15 resulted in increased short channel effects for the transistors in the array 11 as a side effect to improving upon the leakage current. To reduce or eliminate these short channel effects, the halo implant 78 was utilized whereby the DRAM transistors within array 11 maintained decent retention rates with little or no additional and adverse short channel affects. Therefore, the process of FIGS. 1–15 creates an embedded DRAM structure that is improved over existing solutions.

Although the present invention has been described with reference to a specific embodiment, further modifications and improvements will occur to those skilled in the art. For example, the conductivities taught herein may be changed to opposite conductivities to handle formation of complementary devices (i.e., P channel implementations or CMOS ICs with eDRAM). It is to be understood therefore, that the invention encompasses all such modifications that do not depart from the spirit and scope of the invention as defined in the appended claims.

What is claimed is:

1. A method for forming a transistor within a DRAM cell, the transistor having a gate electrode and the method comprising the steps of:

forming a first current electrode adjacent the gate electrode where the first current electrode is formed to a first depth within substrate material and has a first doping concentration, the first current electrode coupling to a storage capacitor for the DRAM cell; and forming a second current electrode adjacent the gate electrode but separated from the first current electrode by a channel region, the second current electrode being formed to a second depth that is greater than the first depth and having a second doping concentration that is greater that the first doping concentration, the second current electrode being coupled to a bit line of the DRAM cell.

2. The method of claim 1 wherein the first and second current electrodes are formed of a first conductivity type and the method further comprising the step of:

forming a doped region within a portion of the channel region and adjacent the second current electrode that has a second conductivity type opposite the first conductivity type.

3. The method of claim 2 wherein the doped region is formed by a tilt and rotational ion implantation process.

4. The method of claim 2 wherein a silicide layer is formed over the second current electrode.

5. The method of claim 4 wherein the silicide layer is not formed over the first current electrode.

6. The method of claim 4 further comprising a step of:

forming a refractory metal region that is coupled to the second current electrode to make a bit line connection to the DRAM cell.

7. The method of claim 6 wherein the refractory metal region comprises primarily tungsten.

8. The method of claim 1 further comprising a step of:
forming a refractory metal region that is coupled to the second current electrode to make a bit line connection to the DRAM cell.

9. The method of claim 8 wherein the refractory metal region comprises primarily tungsten.

10. The method of claim 8 wherein the DRAM cell is formed over a substrate having a first conductivity type and where the method further comprises the steps of:
using an ion implant step to form a buried layer below the channel region of the DRAM cell that has a second conductivity type opposite the first conductivity type;
using an ion implant step to form a well region below the channel region of the DRAM cell that has the first conductivity type;
forming a bias contact to the well region that is coupled to provide a bias to the well region during operation.

11. The method of claim 1 further comprising the step of:
forming a trench capacitor as part of the DRAM cell where the first current electrode is coupled via a sidewall contact to an electrode of the trench capacitor.

12. The method of claim 1 wherein logic gates are formed in parallel to the formation of the DRAM cell on contiguous substrate material.

13. The method of claim 12 wherein the second current electrode of the DRAM cell and the current electrodes of at least one logic gate is formed by a same ion implant operation.

14. The method of claim 12 wherein both the logic gates and the DRAM cell are ion implanted with a halo implant so that: (1) a first portion of the channel region of the DRAM cell is doped more than second portion of the channel region of the DRAM cell where the first and second portions of the channel region are laterally adjacent one another under a DRAM cell gate electrode; and (2) a first portion of the channel region of the a logic gate is doped more than second portion of the channel region of the logic gate where the first and second portions of the channel region are laterally adjacent one another under a gate electrode of the logic gate.

15. The method of claim 1 wherein lightly doped drain regions are formed laterally adjacent both the first and second channel regions.

16. A method for forming a DRAM cell, the method comprising the steps of:
forming a trench capacitor within a substrate;
forming a gate electrode over a substrate region that is laterally adjacent the trench capacitor;
ion implanting first current electrode regions on two sides of the gate electrode, the first current electrodes regions having a first depth, a first peak doping concentration, and a first conductivity type, one of the first current electrode regions being a bit line contact region and the other of the first current electrode regions being a trench capacitor contact region;
ion implanting a second current electrode region adjacent the bit line contact region, the second current electrode region having a second depth greater than the first depth, a second peak doping concentration greater than the first peak doping concentration, and the first conductivity type;
ion implanting a doped region adjacent one of either the bit line contact region or the second current electrode region, the doped region being of a second conductivity type that is opposite the first conductivity type;
siliciding a region above the second current electrode region to form a silicide region while preventing silicidation of the trench capacitor contact region; and
forming a refractory metal contact to the silicide region.

17. The method of claim 16 wherein the refractory metal contact is made of a material comprising tungsten.

18. The method of claim 16 wherein the silicide region is cobalt silicide.

19. The method of claim 16 wherein a nitride barrier layer is formed to prevent silicidation of the trench capacitor contact region.

\* \* \* \* \*